(12) United States Patent
Liu et al.

(10) Patent No.: US 7,872,870 B2
(45) Date of Patent: Jan. 18, 2011

(54) HEAT DISSIPATION DEVICE WITH FASTENER

(75) Inventors: Jian Liu, Shenzhen (CN); Jing Zhang, Shenzhen (CN)

(73) Assignees: Fu Zhun Precision Industry (Shen Zhen) Co., Ltd., Shenzhen, Guangdong Province (CN); Foxconn Technology Co., Ltd., Tucheng, Taipei County (TW)

( * ) Notice: Subject to any disclaimer, the term of this patent is extended or adjusted under 35 U.S.C. 154(b) by 0 days.

(21) Appl. No.: 12/492,139

(22) Filed: Jun. 26, 2009

(65) Prior Publication Data

US 2010/0232113 A1    Sep. 16, 2010

(30) Foreign Application Priority Data

Mar. 13, 2009    (CN) .......................... 200920301287

(51) Int. Cl.
*H05K 7/20* (2006.01)
*F16B 13/00* (2006.01)
(52) U.S. Cl. .......................... 361/719; 361/704; 24/458; 165/80.3
(58) Field of Classification Search ........................ None
See application file for complete search history.

(56) References Cited

U.S. PATENT DOCUMENTS

| | | | |
|---|---|---|---|
| 5,881,800 A * | 3/1999 | Chung ........................ 165/80.3 |
| 6,112,378 A * | 9/2000 | Lee ............................ 24/458 |
| 6,246,584 B1 * | 6/2001 | Lee et al. .................... 361/704 |
| 6,334,750 B1 * | 1/2002 | Hsieh .......................... 411/508 |
| 6,885,805 B2 * | 4/2005 | Asada ......................... 385/134 |
| 7,011,277 B2 * | 3/2006 | Mizukoshi et al. ......... 248/68.1 |
| 7,036,775 B2 * | 5/2006 | Nakanishi ................... 248/68.1 |
| 7,045,715 B2 * | 5/2006 | Ono .......................... 174/72 A |
| 7,145,112 B1 * | 12/2006 | Daughtry et al. ............ 219/521 |
| 7,219,931 B2 * | 5/2007 | Kato .......................... 285/61 |

* cited by examiner

*Primary Examiner*—Boris L Chervinsky
(74) *Attorney, Agent, or Firm*—Frank R. Niranjan

(57) ABSTRACT

An electronic device comprises a printed circuit board, an electronic component mounted on the printed circuit board, a heat dissipation device dissipating heat generated by the electronic component and a plurality of wires on the printed circuit board. The heat dissipation device comprises a heat sink and a pair of fasteners securing the heat sink to the printed circuit board. Each fastener comprises a frame body having a gap defined at a top portion thereof. The wires in a form of a wire harness extend through the gap of the frame body and into the frame body.

16 Claims, 4 Drawing Sheets

HEAT DISSIPATION DEVICE WITH FASTENER

BACKGROUND

1. Technical Field

The disclosure relates to a heat dissipation device and, more particularly, to a heat dissipation device having a fastener for securing a heat sink to an electronic component mounted a printed circuit board.

2. Description of Related Art

With the increasing development of computer technology, electronic components mounted on a printed circuit board such as central processing units (CPUomputers are being made to operate at higher operational speeds and to have greater functional capabilities. When an electronic component operates at a high speed, it frequently generates large amounts of heat. The heat must be quickly removed from the electronic component to prevent it from becoming unstable or being damaged. Typically, a heat sink is attached to an outer surface of the electronic component to absorb heat from the electronic component. The heat absorbed by the heat sink is then dissipated to ambient air.

In order to keep the heat sink in intimate contact with the electronic component, a fastener is used to secure the heat sink to the electronic component. A conventional fastener comprises a pin and a spring disposed around the pin. The pin has a head at an end thereof and a clamping portion at an opposite end thereof. The clamping portion has an anchor-shaped cross-section, and comprises a pair of hooks extending upwardly and outwardly from a bottom thereof towards two opposite sides thereof. A tab extends upwardly from an inner side of each hook. The pin of the fastener passes through the heat sink and the printed circuit board. The spring is compressed between the head of the pin and the heat sink to provide a spring force which makes the hooks of the clamping portion clamping a bottom face of the printed circuit board, thereby attaching the heat sink to the electronic component.

Before the fastener is preassembled to the heat sink, the spring and the pin are separated from each other and not tied together. Operators must coil the spring around the pin of the fastener beforehand. Thus, it is time-consuming to preassemble the fastener on the heat sink.

What is needed, therefore, is a heat dissipation device having a fastener which can overcome problems mentioned above.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
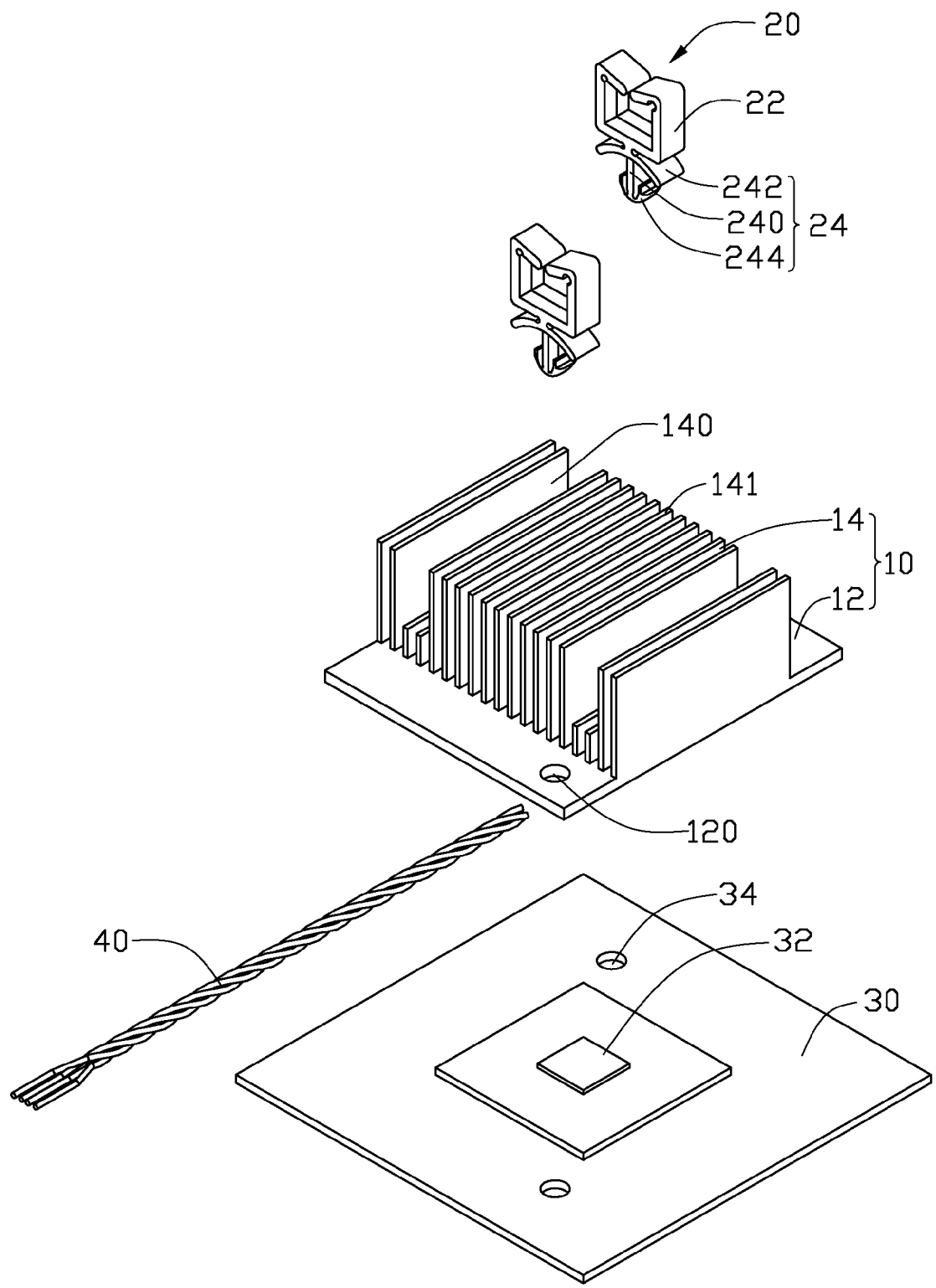
FIG. 1 is an isometric, exploded view of a heat dissipation device in accordance with an embodiment of the disclosure, together with a printed circuit board having an electronic component and a wire harness.
Figure 2:
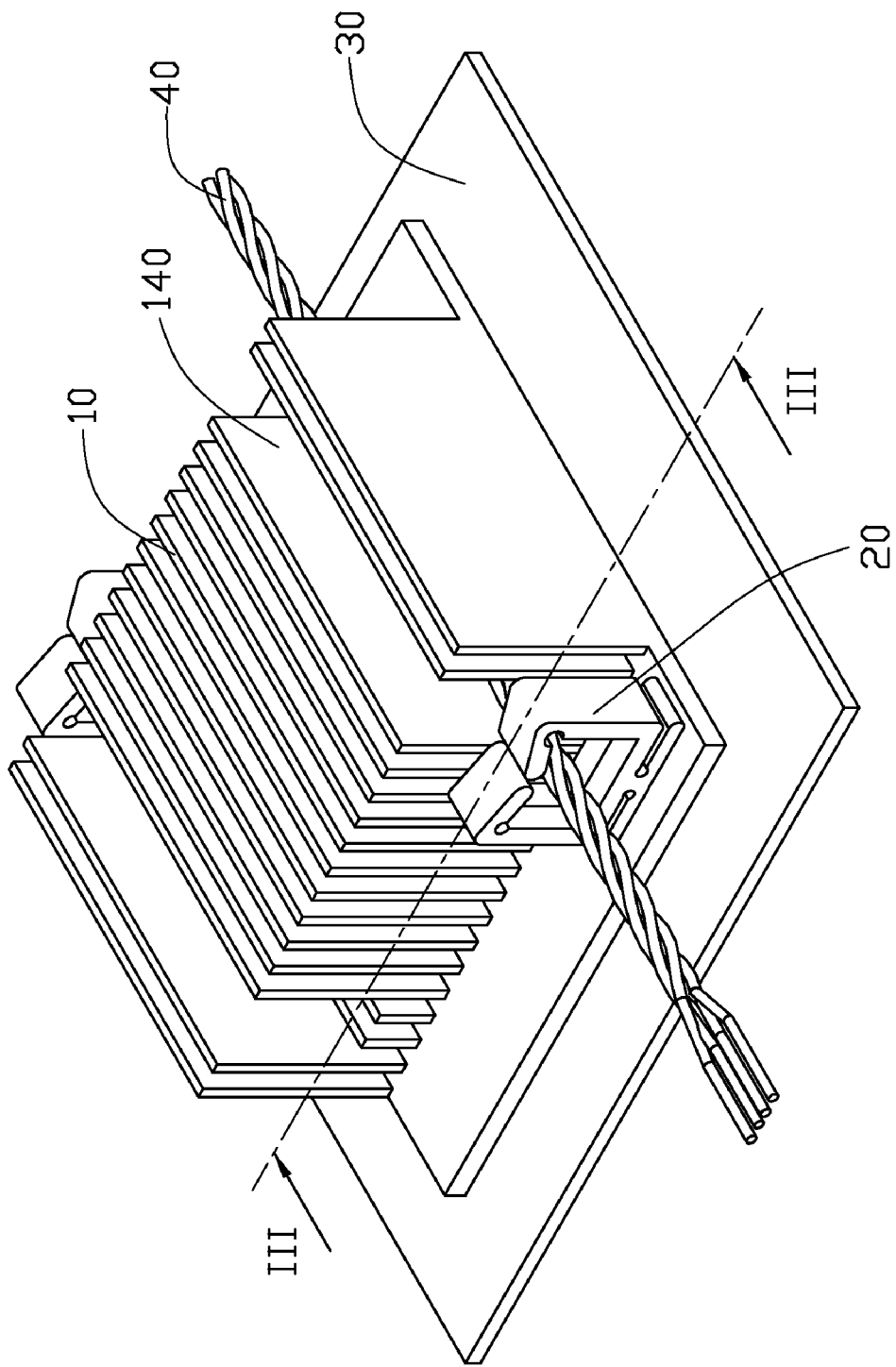
FIG. 2 is an isometric, assembled view of the heat dissipation device, the printed circuit board and the wire harness in FIG. 1.

Referring to FIGS. 1-2, a heat dissipation device in accordance with an embodiment of the disclosure is disposed in a computer enclosure. The heat dissipation device comprises a heat sink 10 and a pair of fasteners 20 for attaching the heat sink 10 to an electronic component 32 mounted on a printed circuit board 30 in the computer enclosure. The heat sink 10 dissipates heat generated by the electronic component 32 to ambient air. A plurality of wires in the computer enclosure are bundled together to form a wire harness 40. The wire harness 40 extends through a top portion of one of the fasteners 20 and the heat sink 10, and is bundled in the fastener 20.

The heat sink 10 is formed with metal materials having good thermal conductivity, such as copper or aluminum. The heat sink 10 comprises a flat base 12 and a fin unit 14 extending upwardly and perpendicularly from a center of the base 12. The fin unit 14 comprises a plurality of spaced parallel fins 141. Two extending holes 120 are defined at two diagonal corners of the base 12, respectively. The fin unit 14 defines two grooves 140 at two opposite lateral sides thereof. The grooves 140 are respectively corresponding to the extending holes 120 and extend through the fin unit 14. In this embodiment, two adjacent fins 141 at each of the two opposite lateral sides of the fin unit 14 have a same height lower than that of other fins 141 therearound to form the grooves 140 for receiving the wire harness 40 therein.

Figure 3:
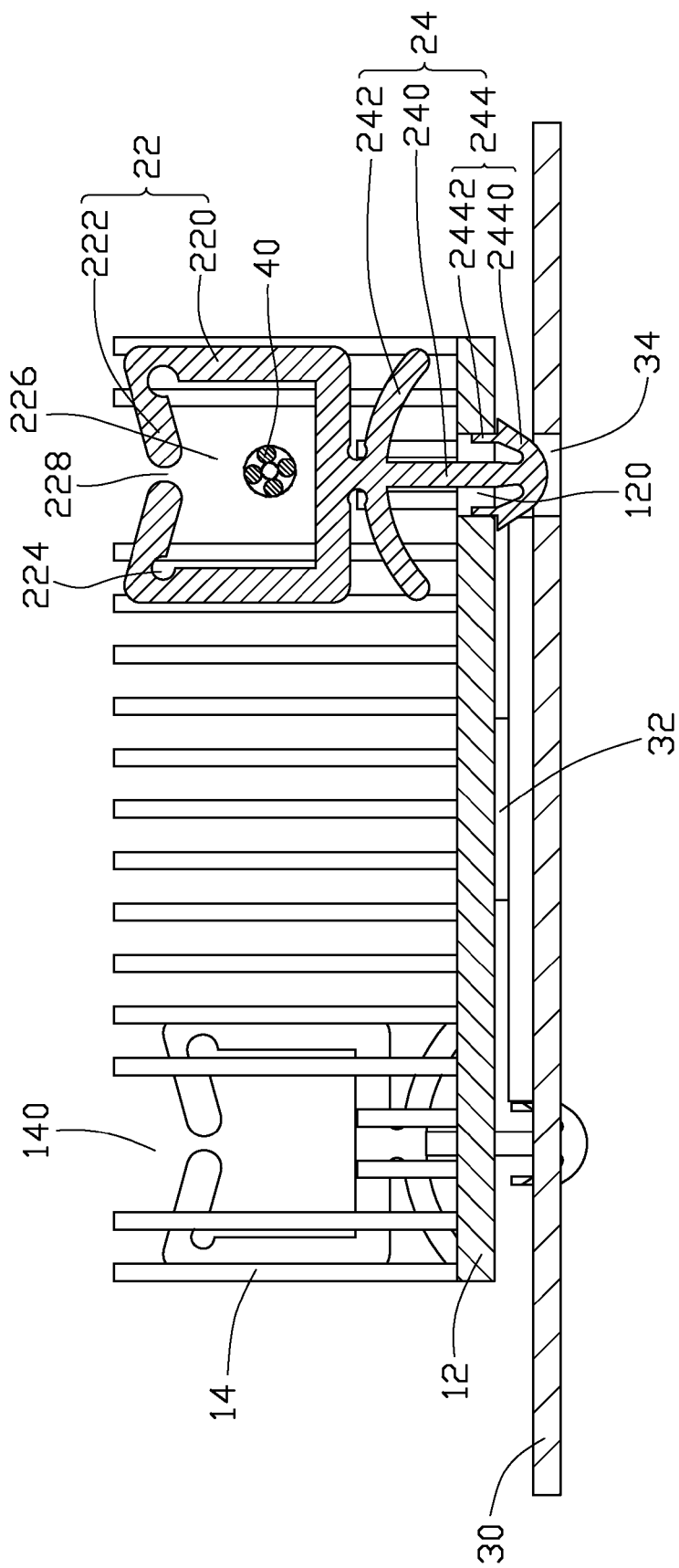
FIG. 3 is a cross section view of the heat dissipation device with the printed circuit board and the wire harness taken along line III-III in FIG. 2, with a fastener in an unlocked state.

Referring to FIG. 3 also, each fastener 20 is integrally made of plastic materials. It is obvious that the fastener 20 can also be made of metal materials. The fastener 20 comprises a frame body 22 and a clamping portion 24 extending downwards from a center of a bottom end of the frame body 22.

The frame body 22 comprises a U-shaped frame 220 and two symmetrical guiding portions 222 extending inwardly from two opposite top ends of the frame 220. The frame 220 and the guiding portions 222 cooperatively define a space 226 for receiving the wire harness 40. Each guiding portion 222 has an acute angle with a corresponding top end of the frame 220 in this embodiment. Alternatively, the angle between the guiding portion 222 and the corresponding top end of the frame 220 can be a right angle. The guiding portions 222 have a gap 228 therebetween so that the wire harness 40 can extend downwards through the gap 228 into the space 226. A width of the gap 228 is smaller than a diameter of the wire harness 40 for preventing the wire harness 40 from escaping from the frame body 22 via the gap 228 after the wire harness 40 is pressed into the space 226. A substantially round cutout 224 is defined at a joint between each guiding portion 222 and the corresponding top end of the frame 220 so that the guiding portion 222 can be elastically bent inwardly and downwardly. The cutout 224 communicates with the space 226 of the frame body 22. When a pressure is exerted on each guiding portion 222 downwardly, the guiding portion 222 is rotated relative to the corresponding top end of the frame 220, and the gap 228 between the guiding portions 222 becomes larger in such a manner that the wire harness 40 having the diameter larger than that of the original gap 228 can extend through the enlarged gap 228.

The clamping portion 24 comprises a strip-shaped pin 240 extending from the center of the bottom end of the frame body 22, a pair of wings 242 extending outwardly and downwardly from a top end of the pin 240 to two opposite lateral sides of the pin 240, and a clasp 244 extending from a bottom end of the pin 240. The wings 242 are symmetric to the pin 240, and define cooperatively an arch arching upwardly from two opposite ends to a center thereof. In other words, the arch cooperatively formed by the wings 242 has a concave facing downwardly and a convex facing upwardly. The wings 242 are spaced from the bottom end of the frame body 22. The clasp 244 has an anchor-shaped cross-section and has a maximum outer diameter thereof greater than that of each of the extending holes 120 of the heat sink 10 so that the clasp 244 can clasp a bottom surface of the heat sink 10. The clasp 244 comprises a pair of hooks 2440 extending upwardly and outwardly from a bottom thereof towards two opposite sides thereof. A tab 2442 extends upwardly from an inner side (i.e., top side) of each hook 2440. An outer diameter of the tab 2442 is slightly greater than that of each of the extending holes 120 so that the tab 2442 can abut against an inner surface of the extending hole 120. A slot (not labeled) is formed between each hook 2440 and the bottom end of the pin 240 so that the hooks 2440 can be deformed elastically when they are compressed towards each other.

The printed circuit board 30 defines two through holes 34 which are disposed adjacent to two diagonally opposite corners of the electronic component 32. The through holes 34 are aligned with the extending holes 120 of the heat sink 10, respectively. The maximum outer diameter of the clasp 244 of each fastener 20 is also greater than that of each of the through holes 34 so that the clasp 244 can clasp a bottom of the printed circuit board 30 after the fastener 20 is fixed on the printed circuit board 30.

Figure 4:
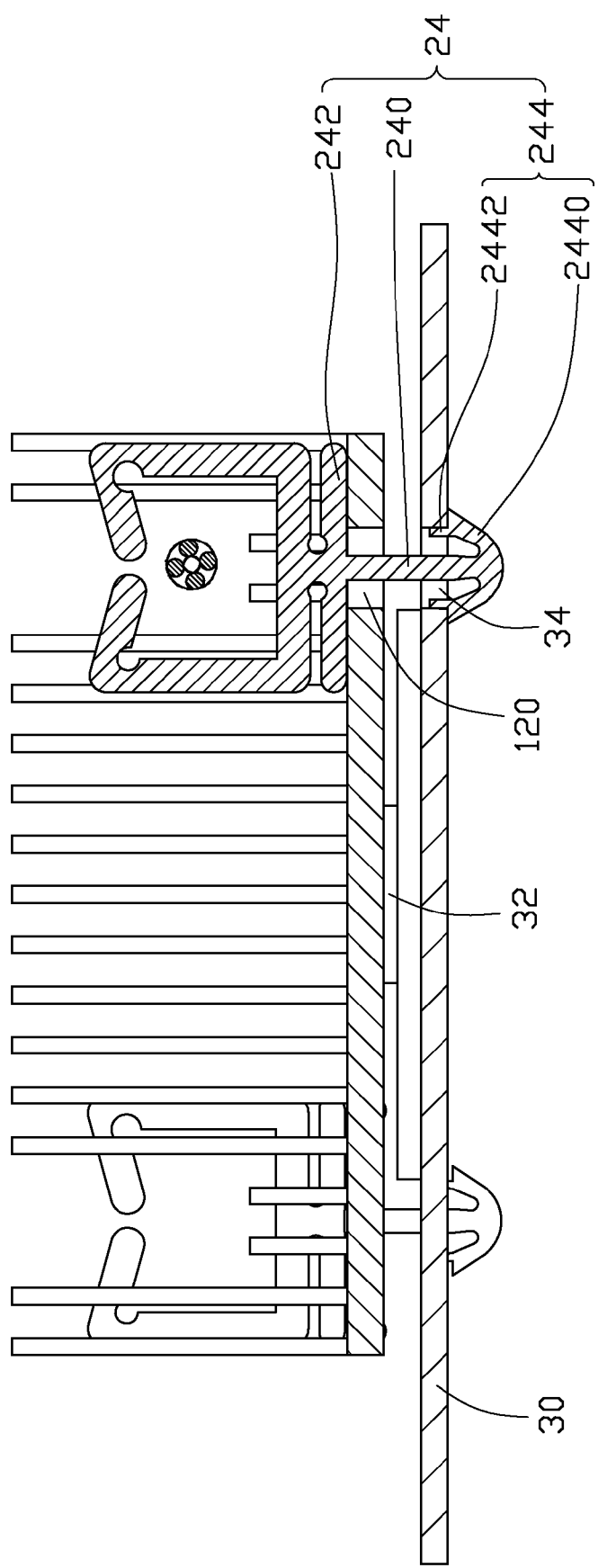
FIG. 4 is a view similar to FIG. 3, with the fastener in a locked state.

Also referring to FIG. 4, in order to preassemble the fasteners 20 on the heat sink 10, the clasps 244 of the fasteners 20 are aligned with the extending holes 120 of the heat sink 10, respectively, and then the frame bodies 22 are pushed downwardly so that the clasps 244 are inserted into and pass through the extending holes 120. In process of preassembling, the hooks 2440 of each clasp 244 are compressed toward each other and then return to its original position. Due to the maximum outer diameter of each clasp 244 being greater than that of each of the extending holes 120, the fasteners 20 are preassembled on the heat sink 10. At the same time, the wings 242 of the fasteners 20 are in a free state.

In order to attach the heat sink 10 with the fasteners 20 to the electronic component 32, the clasps 244 are aligned with the through holes 34 of the printed circuit board 30, and the frame bodies 22 are further pushed downwardly to cause the clasps 244 to insert into and pass through the through holes 34. When the clasps 244 have passed through the through holes 34, the clasps 244 return to their original position. The wings 242 of each fastener 20 are compressed towards the base 12 to provide an upward force which makes each clasp 244 tightly clasp the bottom of the printed circuit board 30. The tabs 2442 of each clasp 244 abut against an inner surface of a corresponding through hole 34, and the hooks 2440 of each clasp 244 have an outer portion thereof abut against a bottom surface of the printed circuit board 30.

An operator pushes downwardly the fasteners 20 and makes the clasps 244 of the fasteners 20 pass through the heat sink 10 and the printed circuit board 30 in sequence. Due to the upward forces produced by the wings 242 of the fasteners 20, the clasps 244 clasp tightly the bottom of the printed circuit board 30, whereby the heat sink 10 is mounted on the printed circuit board 30 and attached to the electronic component 32 tightly. Thus, there is no need to coil a spring around the pin 240 of each fastener 20 beforehand. As a result, it is time-saving and convenient to preassemble the fasteners 20 on the heat sink 10. Additionally, the fasteners 20 each have a frame body 22 which can receive the wire harness 40 therein, which avoids the wire harness 40 from rambling disorderly in the computer enclosure.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A heat dissipation device for dissipating heat generated by an electronic component mounted on a printed circuit board, the heat dissipation device comprising:
   a heat sink comprising a base for absorbing heat from the electronic component, the base defining two holes therethrough; and
   two fasteners respectively engaged in the holes of the base of the heat sink, each of the two fasteners comprising a clamping portion and a frame body disposed at a top end of the clamping portion, the clamping portion comprising a pin extending downwards from the frame body, two wings respectively extending curvedly from a top end of the pin to two opposite lateral sides of the pin, and a clasp formed at a bottom end of the pin, the pin extending through one corresponding hole of the base of the heat sink with the wings located at a top side of the base and the clasp at a bottom side of the base;
   wherein the clasp is adapted for engaging with the printed circuit board, and the wings are compressed to be flat and contact the base when the clasp clasps a bottom of the printed circuit board; and
   wherein a gap is defined at a top portion of the frame body for guiding a plurality of wires extending into the frame body.

2. The heat dissipation device as claimed in claim 1, wherein the frame body comprises a U-shaped frame and two guiding portions respectively extending inwardly from two opposite top ends of the frame, the guiding portions being spaced from each other to form the gap of the frame body.

3. The heat dissipation device as claimed in claim 2, wherein the wires extended in the frame body are bundled to form a wire harness in the frame body, a diameter of the wire harness being larger than a width of the gap for preventing the wire harness from escaping from the frame body.

4. The heat dissipation device as claimed in claim 2, wherein each guiding portion of the frame body maintains an angle not larger than 90 degrees relative to a corresponding top end of the frame.

5. The heat dissipation device as claimed in claim 4, wherein a cutout is defined at a joint of each guiding portion and the corresponding top end of the frame.

6. The heat dissipation device as claimed in claim 1, wherein the heat sink further comprises a fin unit extending upwardly from the base, the fin unit defining two grooves at two opposite lateral sides thereof, the grooves extending through the heat sink, one of the grooves receiving the wires therein.

7. The heat dissipation device as claimed in claim 6, wherein the fasteners are mounted on two diagonal corners of the base of the heat sink, the frame bodies of the fasteners each having a space aligned with a corresponding one of the grooves of the heat sink.

8. An electronic device, comprising:

a printed circuit board;

an electronic component mounted on the printed circuit board;

a heat dissipation device dissipating heat generated by the electronic component, the heat dissipation device comprising a heat sink and two fasteners securing the heat sink to the printed circuit board, wherein each fastener comprises a frame body having a gap defined at a top portion thereof and a clamping portion, the clamping portion comprising a pin extending downwards from the frame body through the heat sink and the printed circuit board, two wings extending curvedly from a top end of the pin to two opposite lateral sides of the pin, and a clasp formed at a bottom end of the pin, the clasp abutting against a bottom side of the printed circuit board, and the wings being compressed to be flat and abutting against a top side of the heat sink; and a plurality of wires on the printed circuit board extending through the gap of the frame body and into the frame body and then being bundled together to form a wire harness.

9. The electronic device as claimed in claim 8, wherein a diameter of the wire harness is larger than a width of the gap of the frame body for preventing the wire harness from escaping from the frame body.

10. The electronic device as claimed in claim 8, wherein the frame body of each fastener comprises a U-shaped frame and two guiding portions extending inwardly from two opposite top ends of the frame, the guiding portions being spaced from each other to form the gap.

11. The electronic device as claimed in claim 10, wherein each guiding portion of the frame body maintains an angle not larger than 90 degrees with respect to a corresponding top end of the frame.

12. The electronic device as claimed in claim 10, wherein the heat sink comprises a base and a fin unit extending up from a top side of the base, the fin unit defining two grooves at two opposite lateral sides thereof respectively aligned with the frame bodies of the fasteners, the wires extending through one of the grooves into the corresponding frame body.

13. The electronic device as claimed in claim 12, wherein the wings of each fastener extend outwardly and downwardly from the pin, and form an arch arching upwardly from two opposite ends thereof to a center thereof.

14. The electronic device as claimed in claim 12, wherein the clasp has an anchor-shaped cross section and comprises a pair of hooks extending upwardly and outwardly from a bottom thereof towards two opposite sides of the pin, and a tab extending upwardly from an inner side of each hook, the hooks abutting against the bottom side of the printed circuit board, the tabs engaging in the printed circuit board.

15. The electronic device as claimed in claim 8, wherein the wings of each fastener extend outwardly and downwardly from the pin, and form an arch arching upwardly from two opposite ends thereof to a center thereof.

16. The electronic device as claimed in claim 8, wherein the clasp has an anchor-shaped cross section and comprises a pair of hooks extending upwardly and outwardly from a bottom thereof towards two opposite sides of the pin, and a tab extending upwardly from an inner side of each hook, the hooks abutting against the bottom side of the printed circuit board, the tabs engaging in the printed circuit board.

* * * * *